(12) United States Patent
Fischer et al.

(10) Patent No.: US 6,711,085 B2
(45) Date of Patent: Mar. 23, 2004

(54) DIGITAL MEMORY CIRCUIT HAVING A PLURALITY OF SEGMENTED MEMORY AREAS

(75) Inventors: Helmut Fischer, Oberhaching (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,190

(22) Filed: Oct. 7, 2002

(65) Prior Publication Data

US 2003/0067820 A1 Apr. 10, 2003

(30) Foreign Application Priority Data

Oct. 5, 2001 (DE) .......................................... 101 49 098

(51) Int. Cl.[7] ................................................ G11C 8/00
(52) U.S. Cl. .................................. 365/230.03; 365/191
(58) Field of Search .............................. 365/230.03, 191

(56) References Cited

U.S. PATENT DOCUMENTS 5,404,338 A * 4/1995 Murai et al. ................. 365/233
6,515,884 B1 * 2/2003 Sywyk et al. .................. 365/49

* cited by examiner

Primary Examiner—Michael Tran
(74) Attorney, Agent, or Firm—Laurence A. Greenberg; Werner H. Stemer; Gregory L. Mayback

(57) ABSTRACT

A digital memory circuit contains a plurality of areas each having memory cells disposed in matrix form in rows and columns. The columns of each memory area is subdivided into a plurality of adjacent groups which each form a segment. For each segment, provision is made of a separate set of two-conductor local data lines which lead via line switches to two-conductor master data lines common to all the memory areas. Furthermore, precharge devices are provided in order to equalize the potentials of the conductors of the local data lines and the conductors of the master data lines, the equalization potential for the local data lines being different than the equalization potential for the master data lines. A line switch control device provides for closing only of the line switches on those local data lines which belong to the segment in which a write or read mode takes place.

1 Claim, 1 Drawing Sheet

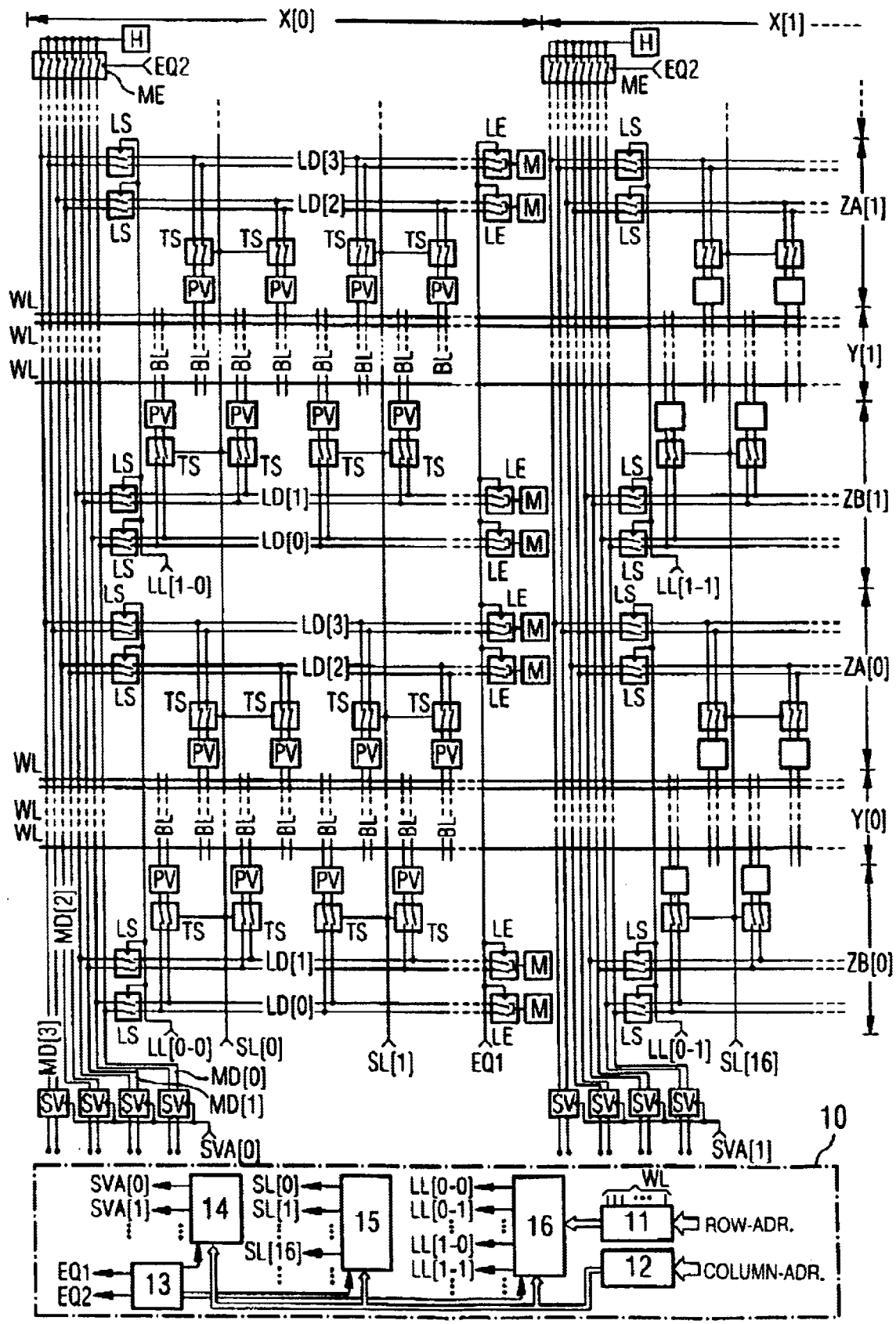

US 6,711,085 B2

DIGITAL MEMORY CIRCUIT HAVING A PLURALITY OF SEGMENTED MEMORY AREAS

BACKGROUND OF THE INVENTION

FIELD OF THE INVENTION

The invention relates to a digital memory circuit that contains at least two areas each having a multiplicity of memory cells, disposed in matrix form in rows and columns, for storing in each case a binary datum. For each column, a primary sense amplifier is provided to sense the datum stored in an addressed cell. A transfer switch, which can be closed by a column selection signal, is provided to put the first core of a two-core local data line, assigned to the relevant primary sense amplifier, at a first logic potential and the second core of the data line at a second logic potential, if the sensed datum has the first binary value, and to put the first core at the second logic potential and the second core at the first logic potential, if the sensed datum has the second binary value. The cores of each local data line are connected via a respective line switch, which can be closed by a line switch through-connect command, to the cores of an assigned two-core master data line, which leads to the input terminals of an individually assigned secondary sense amplifier. Precharge devices are provided in order, prior to a line switch through-connect command, to equalize both cores of all the local data lines to a potential lying between the first and second logic potentials and to equalize both cores of all the master data lines to one of the two logic potentials. The columns of each area of the memory bank form at least two adjacent groups, each of which occupies a dedicated segment of the relevant area. Each local data line is assigned to exactly one segment of exactly one area of the memory bank, and each master data line is assigned to exactly one segment of each area of the memory bank. DRAM memories are a preferred, but not exclusive, field of application of the invention.

In digital data memories, the binary memory cells of each memory bank are often combined in a plurality of separate areas which each have a dedicated set of sense amplifiers, each of which is responsible for a subset of the cells of the relevant area. Usually, the cells of each memory area form a matrix of rows and columns, and each column is assigned a sense amplifier. Each sense amplifier is connected to all the cells of the relevant column via an assigned bit line. Each row can be addressed selectively by activation of an assigned word line. The corresponding activation signal is derived in a word line decoder (row decoder) from the row address of the memory cell to be read. The activation causes each cell of the relevant row to communicate its memory content via the bit line to the sense amplifier assigned to the relevant column, which sense amplifier thereupon generates an amplified signal representing the binary value of the stored datum. This representation, through the closing of a transfer switch individually assigned to the sense amplifier, is then transmitted to an assigned local data line, which can be connected via a line switch to an assigned master data line common to all the memory areas of the bank, in order to transmit the binary representation to a secondary sense amplifier and there to amplify it for the outputting of the datum.

The transfer switches are controlled by column selection signals that are derived by a column decoder from the column address of the memory cells to be read. The column selection signals are jointly fed to all the memory areas.

In many cases, particularly in large memory banks having a very high number of columns in each memory area, the total number n of columns of each area is divided into m adjacent groups, each of which contains k=n/m columns and occupies a corresponding segment of the memory area. Accordingly, the local data lines are also segmented. Each group (that is to say each segment) can in turn be divided into p adjacent subgroups, each of which contains q=k/p columns, in each case all the transfer switches assigned to the sense amplifiers of the same subgroup being driven by a common column selection signal assigned to the subgroup. In order that the data transmitted by the q transfer switches of the respective same subgroup are forwarded separately from one another in these cases, q local data lines are provided along each segment, each of which data lines is connected to exactly one individually assigned transfer switch of each subgroup of the columns of the relevant segment. If q=1, a dedicated column selection signal is generated for each column and thus for each transfer switch.

In accordance with the number m of segments, m bundles of master data lines are provided. Each of the bundles contains q master data lines that are assigned to the q local data lines of a respective segment of all the memory areas.

The bit lines, the local data lines and the master data line usually have two conductors or wires. For this purpose, each primary sense amplifier is configured with a symmetrical output. If the memory cell content that it senses corresponds to a datum of the first binary value, a potential difference whose polarity indicates the binary value of the datum stored in the cell appears at the output of the amplifier. If the cell content corresponds to a datum of the first binary value, then one output terminal of the amplifier goes to a first defined logic potential, and the other output terminal goes to a second defined logic potential. If the cell content corresponds to a datum of the second binary value, then the two logic potentials appear interchanged at the output terminals of the amplifier. Through the closing of the transfer switch with the line switch closed, the output potentials of the sense amplifier are applied to the cores of the assigned local data line and pass via the line switch to the lines of the assigned master data line in order to produce there a potential difference representing the sensed datum. The secondary sense amplifier is therefore configured as a differential amplifier with a symmetrical input. The supply potentials at the base and load ends of the amplifier are symmetrical with respect to the center between the two logic potentials and near one or the other logic potential.

In the quiescent state of the memory circuit, before a read or write mode is initiated, the lines of all the bit lines are equalized to a specific potential, which usually lies in the middle between the two logic potentials. The lines of all the local data lines are likewise equalized to this potential, specifically for the following reason: during the later column selection, the selected transfer switches are indeed closed not only in that memory area which contains the activated word line, but also in all the other memory areas whose bit lines have all maintained the equalization potential. The above-mentioned equalization of the local data lines to exactly this potential avoids unnecessary charging currents in these other memory areas.

In the quiescent state of the memory circuit, the lines of all the master data lines are likewise equalized to a specific potential. One of the two logic potentials is chosen for this second-mentioned equalization potential, specifically that logic potential which corresponds to or approaches the load-side supply potential of the secondary sense amplifiers. This is because the amplifier then remains in the linear region of the amplifier characteristic curve, if the input terminals are driven with the above-mentioned potential difference representing the sensed datum.

Each line switch has a control terminal for the application of a through-connect signal that closes the switch and keeps it closed for the duration of the signal. Before the closing of the line switches and before a transfer switch is closed at any of the primary sense amplifiers, the lines of all the bit lines and all the local data lines are disconnected from the source of their equalization potential; owing to their line capacitance, however, they still retain this potential for the time being.

In the case of memory circuits according to the prior art, all the line switches that are assigned to the same memory area are controlled jointly. Since the row address of an addressed memory cell also identifies the respective memory area, a line switch selecting device according to the prior art operates only depending on the row address decoded in the word line decoder, in order to transmit the through-connect signal simultaneously to all the line switches of the memory area containing the addressed row.

Consequently, if the line switches of a memory area are closed, which usually occurs before the closing of transfer switches in the relevant memory area, both lines of all the local data lines of all the segments of the memory area first go from their equalization potential (still retained until that point), lying in the middle between the two logic potentials, to the equalization potential of the master data lines, which is equal to one of the logic potentials. For this purpose, the source of the equalization potential of the master data lines has to subsequently supply much charging current.

SUMMARY OF THE INVENTION

It is accordingly an object of the invention to provide a digital memory circuit having a plurality of segmented memory areas which overcomes the above-mentioned disadvantages of the prior art devices of this general type, which reduces charging current consumption.

With the foregoing and other objects in view there is provided, in accordance with the invention, a digital memory circuit that has at least one memory bank. The memory bank contains at least two areas each having a multiplicity of memory cells, disposed in a matrix form in rows and columns, the memory cells storing in each case a binary datum. Primary sense amplifiers are provided, and one of the primary sense amplifiers is provided for each of the columns. The primary sense amplifiers sense the binary datum stored in an addressed memory cell of the memory cells. A transfer switch is connected to each of the primary sense amplifiers resulting in a plurality of transfer switches. Two-conductor local data lines are provided and each has a first conductor connected to a respective transfer switch of the transfer switches and a second conductor connected to the respective transfer switch. The respective transfer switch receives and is closed by a column selection signal for putting the first conductor, coupled to a respective primary sense amplifier, at a first logic potential and the second conductor at a second logic potential, if the binary datum sensed has a first binary value, and to put the first conductor at the second logic potential and the second conductor at the first logic potential, if the binary datum sensed has a second binary value. Two-conductor master data lines each having conductors are provided. Line switches are provided and a respective line switch is connected between a respective two-conductor master data line and a respective two-conductor local data line. The first and second conductors of the respective two-conductor local data line are connected through the respective line switch to the conductors of the respective two-conductor master data line. The respective line switch receives and is closed by a line switch through-connect command. Secondary sense amplifiers are provided and each has input terminals connected to the conductors of an assigned one of the two-conductor master data lines. Precharge devices are connected to the first and second conductors of all of the two-conductor local data lines for equalizing both of the first and second conductors of the two-conductor local data lines to a potential lying between the first and second logic potentials. The precharge devices are also connected to the two-conductor master data lines to equalize both of the conductors of all of the two-conductor master data lines to one of the first and second logic potentials. The columns of each of the areas of the memory bank form at least two adjacent groups, and each of the adjacent groups occupies a dedicated segment of a relevant area. Each of the two-conductor local data lines is assigned to exactly one of the dedicated segments of exactly one of the areas of the memory bank. Each of the two-conductor master data lines is assigned to exactly one of the dedicated segments of each of the areas of the memory bank. A line switch control device, depending on row and column addresses of the addressed memory cell, transmit the line switch through-connect command only to the line switches connected to the two-conductor local data lines of the dedicated segment containing the addressed memory cell.

The line switch control device according to the invention thus provides for closing of the line switches on only the local data lines which belong to the segment in which a write or read mode takes place. By virtue of the invention, the charging current consumption from the source of the equalization potential of the master data lines is lower than in conventional practice, because not all the local data lines of the relevant memory area are charged to the equalization potential of the master data lines, but rather only the local data lines of a single segment. If each memory area contains m segments, then the charging current consumption is only about 1/m of the charging current consumption to be expected in the case of the prior art.

Other features which are considered as characteristic for the invention are set forth in the appended claims.

Although the invention is illustrated and described herein as embodied in a digital memory circuit having a plurality of segmented memory areas, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a fragmented, circuit diagram of a construction of a memory circuit according to the invention.

DESCRIPTION OF THE PREFERRED EMBODIMENTS

In the drawing and in the description below, identical elements are designated by identical abbreviations in uppercase letters followed by sequential numbers in brackets [ ]

for closer identification. A colon between two numbers is to be read as the word "to". Thus, e.g. "SL[0:15]" is to be read as "SL[0] to SL[15]".

Furthermore, the following configuration shall hold true: the two logic potentials are designated by H (for "high") and L (for "low"). H and L are defined limit or threshold values on both sides of a potential range whose center is designated as an M level. If it is stated in the description that a circuit point goes to or lies at H or L level, then this generally refers to that the potential "at least" reaches the relevant threshold value.

Referring now to the single FIGURE of the drawing in detail, there is shown two memory areas Y[0] and Y[1] of a DRAM memory circuit in a fragmentary fashion. Each of the memory areas Y[0] and Y[1] contains a multiplicity of memory cells that are disposed in a matrix form in rows and columns. An assigned word line WL runs along each row, and an assigned two-conductor or line bit line BL runs along each column. Situated near each crossover between a word line WL and a bit line BL is a non-illustrated memory cell.

The two memory areas Y[0] and Y[1] shown are part of a memory bank which contains even more of such regions, e.g. a total of eight, which are disposed in alignment in the column direction. The illustration in the drawing could thus be continued upward to a corresponding extent. In the row direction, each memory area forms a plurality of m identical segments, e.g. a total of sixteen. For space reasons, the drawing illustrates only the first two segments X[0] and X[1] in fragmentary fashion. The illustration in the drawing could thus be continued toward the right to a corresponding extent. Along the two edges of each memory area that run transversely with respect to the column direction there extends in each case a strip-type zone ZA and ZB, respectively, in which the access circuits for the columns of the relevant memory area are accommodated. Construction and a number of the access circuits are identical for all the segments of each memory area, so that for the time being it suffices to describe only the access circuits of the first segment X[0] of the first memory area Y[0].

The access circuits contain, for each column, a primary sense amplifier PV, whose input is connected to the lines of the relevant bit line BL, and a two-pole transfer switch TS connected downstream. In each case q=4 adjacent columns form a subgroup, and the q=4 transfer switches TS of each subgroup are controlled via a common column selection line SL. Let it be assumed as an example that each memory area has n=1024 columns, that is to say a total of 1024/4=256 subgroups, divided into m=16 segments, each of which thus contain 64 columns or 16 column subgroups. Accordingly, a total of 256 column selection lines SL[0:255] are provided. The four transfer switches TS of the first subgroup in the first segment X[0] are controlled via the column selection line SL[0], the transfer switches TS of the second subgroup in the first segment X[0] are controlled via the column selection line SL[1], etc. The first subgroup in the second segment X1 is assigned the column selection lines SL[16], etc. up to the last subgroup in the last segment, which is assigned a non-illustrated column selection line SL[255].

For each segment, q=4 two-conductor (line) local data lines LD[0:3] are provided, which extend in the zones ZA and ZB transversely with respect to the column direction. Each of the local data lines are connected to the output of in each case one of the four transfer switches TS of each subgroup. The local data lines LD[0:3] lead via individually assigned line switches LS to q=4 master data lines MD[0:3], which for their part lead to q=4 secondary sense amplifiers SV.

For each segment of a memory area there is a dedicated bundle of in each case four master data lines MD[0:3], which extends in the column direction over all the memory areas and leads to four dedicated secondary sense amplifiers SV. Each bundle is assigned to in each case exactly one segment of each memory area. In a similar manner, the column selection lines SL also extend in the column direction over all the memory areas, and each of these lines SL is assigned in each case to exactly one column subgroup of each of the memory areas.

The line switches LS are separately controllable not only for each memory area, but also, according to the invention, for each segment. For this purpose, the control terminals of all four line switches LS which belong to the same segment are connected to a line switch control line LL assigned only to this segment. Thus, m=16 line switch control lines LL are provided for each memory area, in each case one for each segment. The area Y[0] is assigned line switch control lines LL[0-0:15], the area Y[1] is assigned the line switch control lines LL[1-0:15], etc. The line switches LS are closed if and as long as a through-connect signal is applied to the relevant control line LL.

In the quiescent state of the memory circuit, prior to the initiation of a cell access, all the word lines are held at L level, and the bit lines BL are held at a common precharge or "equalization" potential M, which lies as far as possible exactly between L and H levels. This last is effected by a non-illustrated equalization switch on each bit line BL, which switch is closed by an equalization signal EQ1 in order to connect both conductors of each bit line to a source of the M potential. A similar equalization switch LE, which is controlled by the equalization signal EQ1 in the same way, is situated on the conductors of each local data line LD in order also to equalize the conductors to an M potential. On all the master data lines MD, too, equalization switches ME are provided which are likewise closed by a control signal EQ2 in the quiescent state in order to hold the conductors (lines) of all the master data lines MD at H potential. All the line switches LS are open in the quiescent state, so that all the local data lines LD are decoupled from the master data lines MD.

During the quiescent state, all the transfer switches TS are also open (i.e. non-conducting), so that all the primary sense amplifiers PV are disconnected from the local data lines LD. In order to initiate a cell access, the row address of the desired memory cell is analyzed. The signal EQ1 is deactivated in order to disconnect the conductors of the bit lines BL and of the local data line LD from the M potential. This is followed shortly afterward by the activation of a word line WL of some segment of some memory area, selected by the row address of the memory cells to be read, i.e. the selected word line is switched to H level.

A short time later all the primary sense amplifiers PV of at least the affected memory area are switched on. The activation lines provided for this purpose are not illustrated in the drawing, for reasons of clarity. Each switched-on primary sense amplifier PV toggles into one or the other of two defined switching states which are characterized in that, at the two-line amplifier output, the first line goes to H and the second line goes to L, or vice versa, depending on the binary value of the datum in that cell of the column assigned to the sense amplifier which is selected by the activated word line. The column address is then analyzed, and, depending on the relevant address, the four line switches LS of the segment in which the desired cell is located are closed via the assigned control line LL in order to connect the local data lines LD[0:3] of only this segment to the assigned master data lines MD[0:3] and thus to subject them to charge reversal from the M potential to the H potential. The charge-reversal current required for this purpose must be applied by the H potential source. Since the local data lines of only a single segment are subjected to charge reversal, the total current is relatively low.

It is now possible to connect selected specimens of the sense amplifiers LV to the associated secondary sense amplifiers SV for a read or write mode via the local data lines LD and the master data line MD of the relevant segment. For this purpose, the four transfer switches TS of a subgroup selected by the column address are closed. This is done by the application of a through-connect signal to the corresponding column selection line SL. The equalization switches ME of the master data line MD were previously opened by removing the control signal EQ2, so that all the master data lines were decoupled from the M potential source.

With the closing of the four transfer switches TS of the selected subgroup, the data-specific potential differences are transmitted from the outputs of the assigned primary sense amplifiers PV onto the four local data lines LD[0:3] which were put at M potential in the quiescent state by the equalization switches LE and have still retained this potential even after the opening of the switch. Consequently, in each local data line of the segment, one line jumps from the M potential to the H potential, and the other line jumps from M to L.

In a read mode, that is to say for outputting the four data at the secondary sense amplifiers SV, these must be driven from the local data lines LD via the master data lines MD. For writing, the potential differences corresponding to the data to be written in can be transmitted from the local data lines via the transfer switches TS and the primary sense amplifiers PV onto the bit lines BL. If a datum is identical to the previous memory datum, then there is no change to the switching state of the relevant primary sense amplifier PV. However, if the new datum has the opposite binary value (reversed potential difference), then the relevant primary sense amplifier PV must be toggled into the other switching state.

The read mode is performed as now described. After the establishment of the potential differences transmitted by the conducting transfer switches TS on the local data lines LD[0:3] of the segment and the assigned master data lines MD[0:3], the four assigned secondary sense amplifiers SV are switched on by the application of an activation signal SVA assigned to the relevant segment, so that the data-specific potential differences appear in amplified form at the outputs of the amplifiers and are forwarded via a non-illustrated input/output circuit. Afterward, the conducting transfer switches TS are opened, and the four secondary sense amplifiers SV are switched off again by the removal of the activation signal SVA.

For the sake of completeness, a write mode shall also be briefly explained, specifically with reference to the exemplary case where, immediately after the read operation described above, new data are written to the previously read memory cells. At the same time as the secondary sense amplifiers SV are switched off (or immediately afterward), the equalization switches ME for all the master data lines MD are temporarily closed, so that these lines go to H level again. After a certain stabilization time, the equalization switches ME are opened again, and the four transfer switches TS of the selected subgroup are closed again by the assigned column selection signal SL. Afterward, the potential differences corresponding to the data to be written in are applied externally to the master data lines MD[0:3], which can be done e.g. via non-illustrated auxiliary paths at the secondary sense amplifiers SV. The potential differences are transmitted via the four closed line switches LS of the affected segment onto the local data lines LD[0:3] and from there via the closed transfer switches TS of the relevant subgroup to the output terminals of the assigned primary sense amplifiers PV. This sets the switching states of the primary sense amplifiers PV in a generally known manner such that conductors of the connected bit lines BL assume the potential differences corresponding to the data to be written in, which results in that these data are stored in the selected memory cells. After the write operation, the four secondary sense amplifiers SV are switched off again.

After the secondary sense amplifiers have been switched off, whether it is after a write operation or after a read operation, the access to the selected memory cells can be ended. At the latest prior to a new access to cells of any segment in any of the memory areas, the previously closed line switches LS are opened again, and all the equalization switches LE and ME are closed again. As a result of this, the potential differences H–L on the cores of the local data lines LD[0:3] of the selected segment, on which the previous write or read mode took place, are equalized to the mean potential $M=(H+L)/2$, and the potential differences H–L on the master data lines MD[0:3] which are assigned to this segment are equalized to H.

The control, activation and through-connect signals described can be derived from the time signals of the timing device of the memory with combination with the address information. A block diagram of a control system suitable for this purpose is shown in the bottom part of the drawing.

The control system, designated in its entirety by 10, uses a word line decoder 11, which receives row address, a column decoder 12, which receives column address, and a timing device 13. The word line decoder 11 activates the word line WL determined by the row address. A first control circuit 14 determines from the column address information the addressed segment and generates therefrom, under timing control by the timing device 13, the activation signal SVA for the secondary sense amplifiers SV assigned to the segment. A second control circuit 15 determines from the column address information the addressed column subgroup and generates therefrom, under timing control by the timing device 13, the through-connect signal on that specimen of the column selection lines which is assigned to the subgroup. A line switch control device 16 determines from the row address information and from the column address information the addressed segment and generates therefrom, under timing control by the timing device 13, the through-connect signal selectively only on that line switch control line LL which leads to the line switches LS of the addressed segment. The control signal EQ1 for the equalization of the local data lines LD (and also of the bit lines) and the control signal EQ2 for the equalization of the master data lines MD are generated directly by the timing device 13.

Of course, the invention is not restricted to the exemplary embodiment described with reference to the drawing. The number q of columns per subgroup may also be other than 4, e.g. 2 or even only 1. Preferably, q is an integer power of 2. In the example described, q>1 secondary sense amplifiers SV are in each case activated jointly, so that data are output or input at these amplifiers in q-bit parallel form. Conversion into serial form can be effected, if desired, e.g. by a downstream-connected shift register with parallel input, as is known per se.

For the sake of clarity, all the switches in the drawing are depicted as mechanical switches, although in reality electronic switching devices are involved, which are preferably formed by field-effect transistors.

We claim:

1. A digital memory circuit, comprising:

at least one memory bank containing:

at least two areas each having a multiplicity of memory cells, disposed in a matrix form in rows and columns, said memory cells storing in each case a binary datum;

primary sense amplifiers, one of said primary sense amplifiers provided for each of said columns, said primary sense amplifiers sensing the binary datum stored in an addressed memory cell of said memory cells;

a transfer switch connected to each of said primary sense amplifiers resulting in a plurality of transfer switches;

two-conductor local data lines each having a first conductor connected to a respective transfer switch of said transfer switches and a second conductor connected to said respective transfer switch, said respective transfer switch receiving and closed by a column selection signal for putting said first conductor, coupled to a respective primary sense amplifier, at a first logic potential and said second conductor at a second logic potential, if the binary datum sensed has a first binary value, and to put said first conductor at the second logic potential and said second conductor at the first logic potential, if the binary datum sensed has a second binary value;

two-conductor master data lines each having conductors;

line switches, a respective line switch connected between a respective two-conductor master data line and a respective two-conductor local data line, said first and second conductors of said respective two-conductor local data line connected through said respective line switch to said conductors of said respective two-conductor master data line, said respective line switch receiving and closed by a line switch through-connect command;

secondary sense amplifiers each having input terminals connected to said conductors of an assigned one of said two-conductor master data lines;

precharge devices connected to said first and second conductors of all of said two-conductor local data lines for equalizing both of said first and second conductors of said two-conductor local data lines to a potential lying between the first and second logic potentials, said precharge devices also connected to said two-conductor master data lines to equalize both of said conductors of all of said two-conductor master data lines to one of the first and second logic potentials;

said columns of each of said areas of said memory bank forming at least two adjacent groups, each of said adjacent groups occupying a dedicated segment of a relevant area;

each of said two-conductor local data lines assigned to exactly one of said dedicated segments of exactly one of said areas of said memory bank;

each of said two-conductor master data lines assigned to exactly one of said dedicated segments of each of said areas of said memory bank; and a line switch control device, depending on row and column addresses of said addressed memory cell, transmitting the line switch through-connect command only to said line switches connected to said two-conductor local data lines of said dedicated segment containing said addressed memory cell.

* * * * *